(12) United States Patent
Ng et al.

(10) Patent No.: US 7,398,445 B2
(45) Date of Patent: *Jul. 8, 2008

(54) METHOD AND SYSTEM FOR DEBUG AND TEST USING REPLICATED LOGIC

(75) Inventors: Chun Kit Ng, Portland, OR (US); Mario Larouche, Portland, OR (US)

(73) Assignee: Synplicity, Inc., Sunnyvale, CA (US)

( * ) Notice: Subject to any disclaimer, the term of this patent is extended or adjusted under 35 U.S.C. 154(b) by 253 days.

This patent is subject to a terminal disclaimer.

(21) Appl. No.: 11/195,180

(22) Filed: Aug. 2, 2005

(65) Prior Publication Data

US 2006/0259834 A1    Nov. 16, 2006

Related U.S. Application Data

(63) Continuation-in-part of application No. 11/112,092, filed on Apr. 22, 2005, now Pat. No. 7,213,216.

(51) Int. Cl.
 *G06F 11/00* (2006.01)
(52) U.S. Cl. .................. 714/741; 714/11; 714/21; 714/25; 714/37; 714/45; 714/724; 714/729; 714/734; 703/13; 703/15; 703/19; 703/22; 716/4; 716/5; 716/6
(58) Field of Classification Search ............. None
See application file for complete search history.

(56) References Cited

U.S. PATENT DOCUMENTS 5,309,035 A    5/1994    Watson, Jr. et al.

(Continued)

FOREIGN PATENT DOCUMENTS

EP    1168206 A2    1/2002

OTHER PUBLICATIONS

Koch et al., "Breakpoints and Breakpoint Detection in Source-Level Emulation", ACM Transactions on Design Automation Systems, vol. 3 No. 2, Apr. 1998, pp. 209-230.*

(Continued)

*Primary Examiner*—John P Trimmings
(74) *Attorney, Agent, or Firm*—Blakely, Sokoloff, Taylor & Zafman LLP

(57) ABSTRACT

A method and system for debug and test using replicated logic is described. A representation of a circuit is compiled. The circuit includes a replicated portion and delay logic to delay inputs into the replicated portion. The circuit may also include trigger logic and clock control logic to enable execution of the replicated portion of the circuit to be paused when a trigger condition occurs. The compiled representation of the circuit may be programmed into a hardware device. A debugger may then be invoked. One or more triggering signals are selected. For each selected triggering signal, one or more states are selected to setup a trigger condition. The hardware device may then be run. The replicated portion of the circuit will be paused when the trigger condition occurs. The states of registers in the replicated portion of the circuit and the sequence of inputs that led to the trigger condition are recorded. This recorded data may then used to generate a test to be run on a software simulator when the circuit is modified.

19 Claims, 4 Drawing Sheets

U.S. PATENT DOCUMENTS

| | | | |
|---|---|---|---|
| 5,706,473 A | 1/1998 | Yu et al. | |
| 5,923,676 A | 7/1999 | Sunter et al. | |
| 6,269,467 B1 | 7/2001 | Chang et al. | |
| 6,519,754 B1 | 2/2003 | McElvain et al. | |
| 6,580,299 B2 * | 6/2003 | Horan et al. | 327/158 |
| 6,668,364 B2 * | 12/2003 | McElvain et al. | 716/7 |
| 6,687,882 B1 * | 2/2004 | McElvain et al. | 716/3 |
| 6,871,329 B2 * | 3/2005 | Matsumoto | 716/4 |
| 6,904,576 B2 | 6/2005 | Ng et al. | |
| 7,010,769 B2 * | 3/2006 | McElvain et al. | 716/9 |
| 7,055,117 B2 * | 5/2006 | Yee | 716/4 |
| 7,065,481 B2 * | 6/2006 | Schubert et al. | 703/14 |
| 2001/0025369 A1 | 9/2001 | Chang et al. | |
| 2003/0069724 A1 | 4/2003 | Schubert et al. | |
| 2003/0115564 A1 * | 6/2003 | Chang et al. | 716/8 |
| 2004/0030999 A1 | 2/2004 | Ng et al. | |
| 2004/0215435 A1 * | 10/2004 | Hunt et al. | 703/15 |

OTHER PUBLICATIONS

PCT International Search Report for PCT International Appln No. US03/24601, mailed Apr. 16, 2004 (7 pages).

Koch, Gernot H., et al. "Breakpoints and Breakpoint Detection in Source-Level Emulation," *ACM Transactions on Design Automation of Electronic Systems*, 3:2 (Apr. 1998), pp. 209-230.

PCT International Search Report and Written Opinion for PCT International Appln No. US2006/030417, mailed Jan. 8, 2007 (10 pages).

PCT International Search Report and Written Opinion for PCT International Appln No. US2006/013910, mailed Feb. 1, 2007 (12 pages).

PCT International Preliminary Report on Patentability for PCT Appln No. US03/24601, mailed Feb. 12, 2007 (6 pages).

* cited by examiner

METHOD AND SYSTEM FOR DEBUG AND TEST USING REPLICATED LOGIC

PRIORITY INFORMATION

This application is a continuation-in-part (CIP) of application Ser. No. 11/112,092, filed Apr. 22, 2005 now U.S. Pat. No. 7,213,216.

TECHNICAL FIELD

Embodiments of the invention relate to the field of debugging and testing integrated circuits, and more specifically to debugging and testing integrated circuits using replicated logic.

BACKGROUND

For the design of digital circuits, designers often employ computer aided techniques. Standard languages, such as Hardware Description Languages (HDLs), have been developed to describe digital circuits to aid in the design and simulation of complex digital circuits. As device technology continues to advance, various product design tools have been developed to adapt HDLs for use with newer devices and design styles.

After the HDL code is written and compiled, the design of an integrated circuit (IC) or a system which includes multiple ICs must be verified to be correct. Continually advancing processing technology and the corresponding explosion in design size and complexity have led to verification problems for complex circuit designs, such as Application Specific Integrated Circuits (ASICs) that are difficult to solve using traditional simulation tools and techniques.

As a result, some designers build prototype boards using multiple ICs such as field programmable gate arrays (FPGAs) to verify their ASIC designs. However, there are still problems with debugging the hardware design. When an error is detected during debug, designers may attempt to tap signals of interest from the circuit and use a logic analyzer to determine the cause of the error. However, this is a difficult process and is often not effective, especially in the case of intermittent errors. Errors that have already occurred are often difficult to repeat and reconstruct.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

Embodiments of a system and method for debugging and testing using replicated logic are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
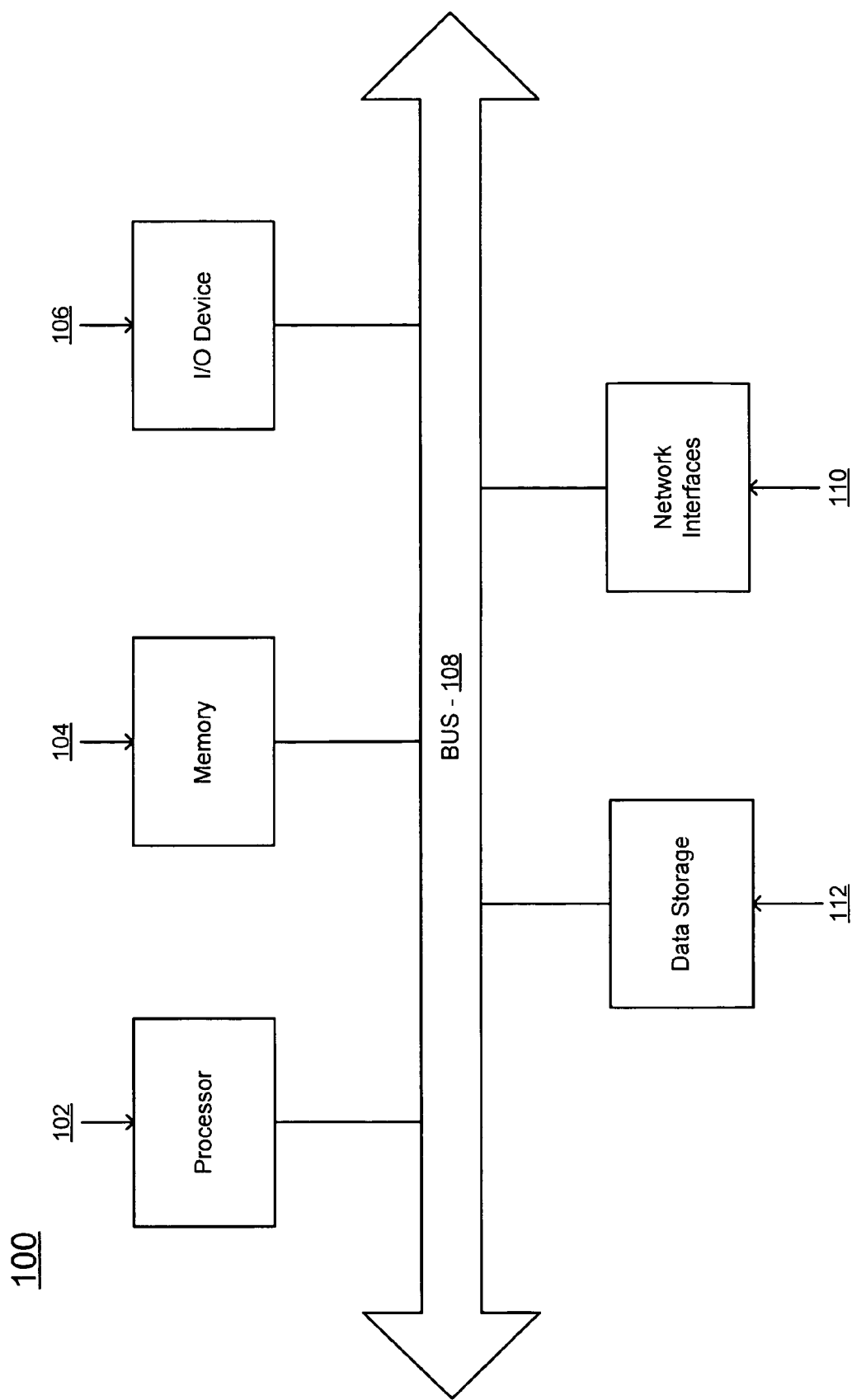
FIG. 1 is a block diagram illustrating a suitable computing environment in which certain aspects of the invention may be practiced.

FIG. 1 is a block diagram illustrating a suitable computing environment in which certain aspects of the illustrated invention may be practiced. In one embodiment, the method described above may be implemented on a computer system 100 having components that include a processor 102, a memory 104, an Input/Output (I/O) device 106, a data storage device 112, and a network interface 110, coupled to each other via a bus 108. The components perform their conventional functions known in the art and provide the means for implementing the system of the invention. Collectively, these components represent a broad category of hardware systems, including but not limited to general purpose computer systems, mobile or wireless computing systems, and specialized packet forwarding devices. It is to be appreciated that various components of computer system 100 may be rearranged, and that certain implementations of the present invention may not require nor include all of the above components. Furthermore, additional components may be included in system 100, such as additional processors (e.g., a digital signal processor), storage devices, memories (e.g. RAM, ROM, or flash memory), and network or communication interfaces.

As will be appreciated by those skilled in the art, the content for implementing an embodiment of a method of the invention, for example, computer program instructions, may be provided by any machine-readable media which can store data that is accessible by system 100, as part of or in addition to memory, including but not limited to cartridges, magnetic cassettes, flash memory cards, digital video disks, random access memories (RAMs), read-only memories (ROMs), and the like. In this regard, the system 100 is equipped to communicate with such machine-readable media in a manner well-known in the art.

It will be further appreciated by those skilled in the art that the content for implementing an embodiment of the method of the invention may be provided to the system 100 from any external device capable of storing the content and communicating the content to the system 100. For example, in one embodiment, the system 100 may be connected to a network, and the content may be stored on any device in the network.

Figure 2:
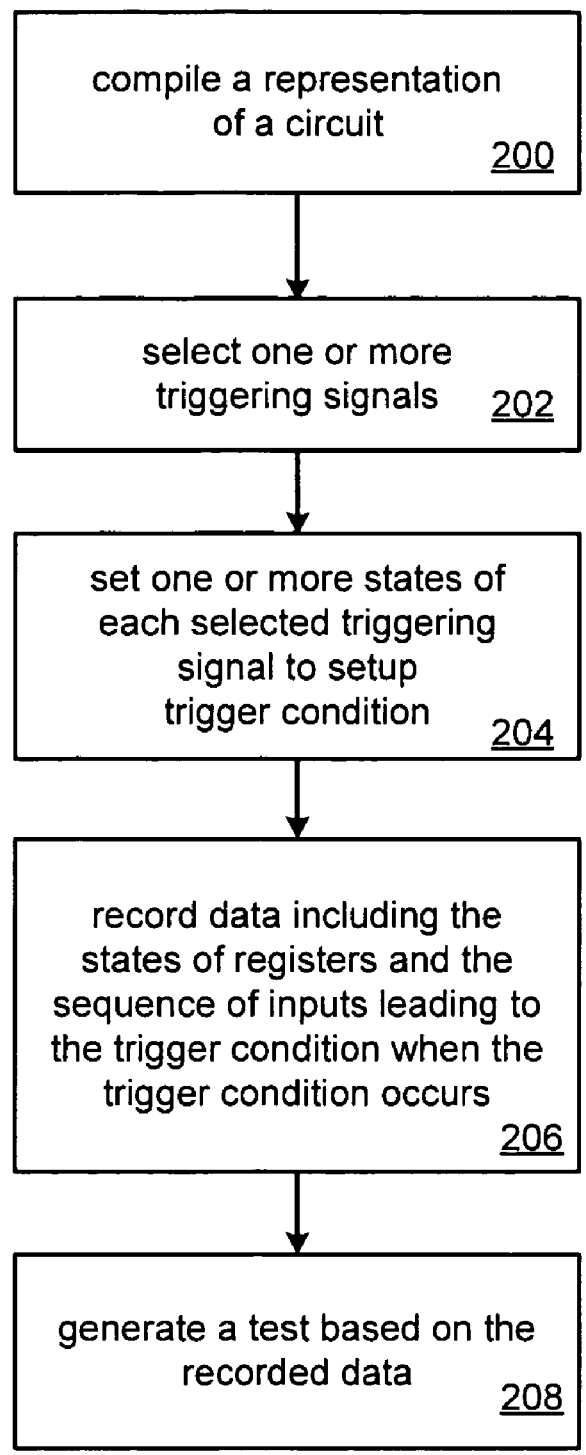
FIG. 2 is a flow chart illustrating an embodiment of a method of the invention.

FIG. 2 is a flow chart illustrating an embodiment of a method of the invention. At 200, a representation of a circuit is compiled. In one embodiment, the compilation generates a first register transfer (RTL) netlist. In one embodiment, the circuit is described by a text representation by writing Hardware Description Language (HDL) source code descriptions of the elements of the circuit. In one embodiment, the circuit is described by a netlist representation.

The representation of the circuit is then input into a compiler. One example of a compiler is a logic synthesis compiler, which is typically a computer program that operates on a general purpose computer system, although in some embodiments, the computer system may be a dedicated, special purpose computer system. After compilation, a RTL netlist may be generated. The RTL netlist usually shows registers and other logic interconnected to show the flow of data through the circuit.

In one embodiment of the invention, the RTL netlist is mapped to a target architecture. The target architecture is typically determined by a supplier of the integrated circuit (IC). Examples of target architectures include field programmable gate arrays (FPGAs) and complex programmable logic devices from vendors such as Altera, Lucent Technologies, Advanced Micro Devices (AMD), and Lattice Semiconductor. The mapping operation converts the RTL level description of the desired circuit into the equivalent circuit implemented using building blocks of the target architecture. A technology specific netlist is generated. Conventional place and route software tools may then be used to create a design of circuitry in the target architecture.

For debugging purposes, IC designers may build prototype boards using multiple ICs such as FPGAs to verify their designs. For example, after the compilation, mapping, and place and route operations, the circuit may be programmed into FPGAs to create a prototype of the design. The FPGAs can then be tested to determine any problem areas in the design.

When a problem area is found in the design, the designer may further analyze the problem by selecting that portion of the circuit to replicate and by inserting trigger logic. One or more signals may be selected for triggering. These selected signals may be used later as trigger signals to enable a trigger condition. Triggering logic may then be inserted into the circuit. One or more controllers for the triggering logic may also be inserted into the circuit. A portion of the circuit may then be selected for replication and the selected portion of the circuit is replicated. This replication may include a replication of the logic elements, the input signals, and the output signals of the selected portion of the circuit. In one embodiment, each register in the replicated portion of the circuit is connected together in a scan chain, such as a JTAG chain. This scan chain allows information from the registers, such as their states, to be scanned out during debug.

In one embodiment of the invention, clock signals are also replicated. Clock control logic is inserted to control the clock signals. The clock control logic allows the clock to the replicated logic block to be paused to stop the replicated logic from executing when certain conditions are present and to allow for single-stepping through the replicated logic to analyze an error. The designer may select a breakpoint to pause the clock to the replicated portion of the circuit when certain conditions are present. For example, the designer may choose values for the outputs or inputs that will pause the clock. This allows the designer to analyze the selected logic more carefully when certain problem conditions are present.

Delay logic may be inserted to delay inputs into the replicated portion of the circuit. The length of the delay may be selected by the circuit designer. The delay logic allows an error observed in the selected portion of the circuit to be analyzed after the error is seen to occur since the error will reappear in the replicated portion of the circuit at a later time.

The representation of the circuit may then be recompiled. In one embodiment, the compilation generates a second RTL netlist. Then, the mapping and place and route operations may be performed using the second RTL netlist to implement the circuit in a target architecture, such as a FPGA. In one embodiment of the invention, a synthesis operation is performed to generate an application specific integrated circuit (ASIC) from the second RTL netlist. A circuit with replicated logic is produced that allows a circuit designer to analyze a problem area in the design. The designer may invoke a debugger to assist in the debugging of the circuit.

At 202, one or more triggering signals are selected. These signals may be selected from the set of signals chosen previously, as discussed above. At 204, one or more states of each selected triggering signal are set to setup a triggering condition. At 206, when the trigger condition occurs, data is recorded. This data includes one or more states of one or more registers and the sequence of inputs that led to the trigger condition. The replicated logic may be stepped clock by clock with the value of the inputs recorded at every clock. This input stream represents the sequence of inputs leading to the trigger condition that is being analyzed. The states of the registers in the replicated logic may also be recorded by using the scan chain implemented as described above.

In one embodiment, the recorded data may be converted into a format that is compatible with a software simulator. For example, if the software simulator is a VHDL or a Verilog simulator, then the recorded information may be converted to VHDL or Verilog, respectively. In one embodiment, the formatted recorded data may then be input into the software simulator to debug logic problems in the circuit design. In one embodiment, the recorded data may be input into the software simulator to verify that the circuit design remains functional when changes to the logic are made.

At 208, a test is generated using the data recorded at 206. The test includes a sequence of inputs and internal states of registers that are based on the recorded sequence of inputs that led to the trigger condition and the recorded internal states of registers. The test may then be input into a software simulator and run when the circuit is modified to verify that the circuit remains functional. This test may be run each time the circuit is modified to ensure that the circuit is still working as expected after any modifications.

Figure 3:
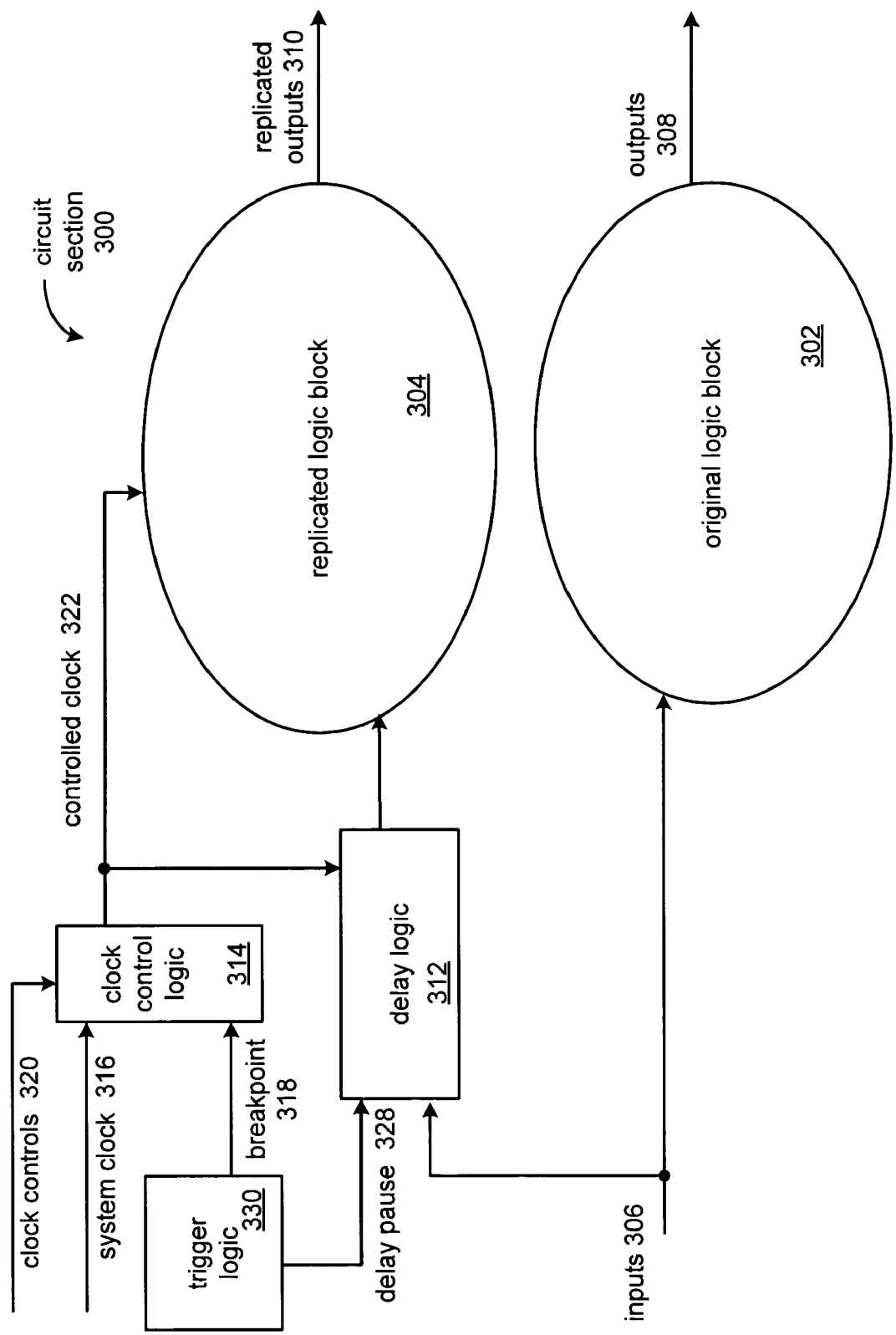
FIG. 3 illustrates an example of a circuit section implementing an embodiment of the invention.

FIG. 3 illustrates an example of a section of a circuit 300 implementing an embodiment of the invention. Logic block 302 is a portion of the circuit in the original IC design. Debug of the original IC design revealed a problem with logic block 302. Therefore, original logic block 302 was selected and replicated to enable further analysis of the problem. The original logic block 302 is replicated to produce a replicated logic block 304. Outputs 308 from the original logic block 302 are replicated to produce replicated outputs 310. Inputs 306 may also be replicated.

Delay logic 312 is inserted to delay inputs 306 into replicated logic block 304. The delay logic includes typical circuit logic and elements, such as inverters, that cause the inputs 306 to arrive at the replicated logic block 304 later in time than the inputs 306 will arrive at the original logic block 302. In this way, an error can be analyzed after the error is seen to occur in the original logic block, since the error will appear in the replicated logic block at a later time.

Trigger logic 330 is inserted into the circuit to enable the setup of a trigger condition that pauses the replicated portion of the circuit. One or more controllers may also be inserted to control the trigger logic. The trigger logic 330 has two outputs: breakpoint 318 and delay pause 328. Breakpoint 318 enables the clock control logic 314 to stop advancing. Delay pause 328 enables the delay logic 312 to stop advancing.

Clock control logic 314 is inserted to control the clock signals 322 to the replicated logic block 304. The clock control logic 314 contains typical logic and circuit elements that allow the clock 322 to the replicated logic block 304 to be paused to stop the replicated logic from executing when certain conditions are present. The clock control logic 314 may also allow for single stepping through the replicated logic on a clock by clock basis to analyze an error. The breakpoint 318 may be set to pause the clock when certain conditions are present, such as when the trigger condition occurs.

Figure 4:
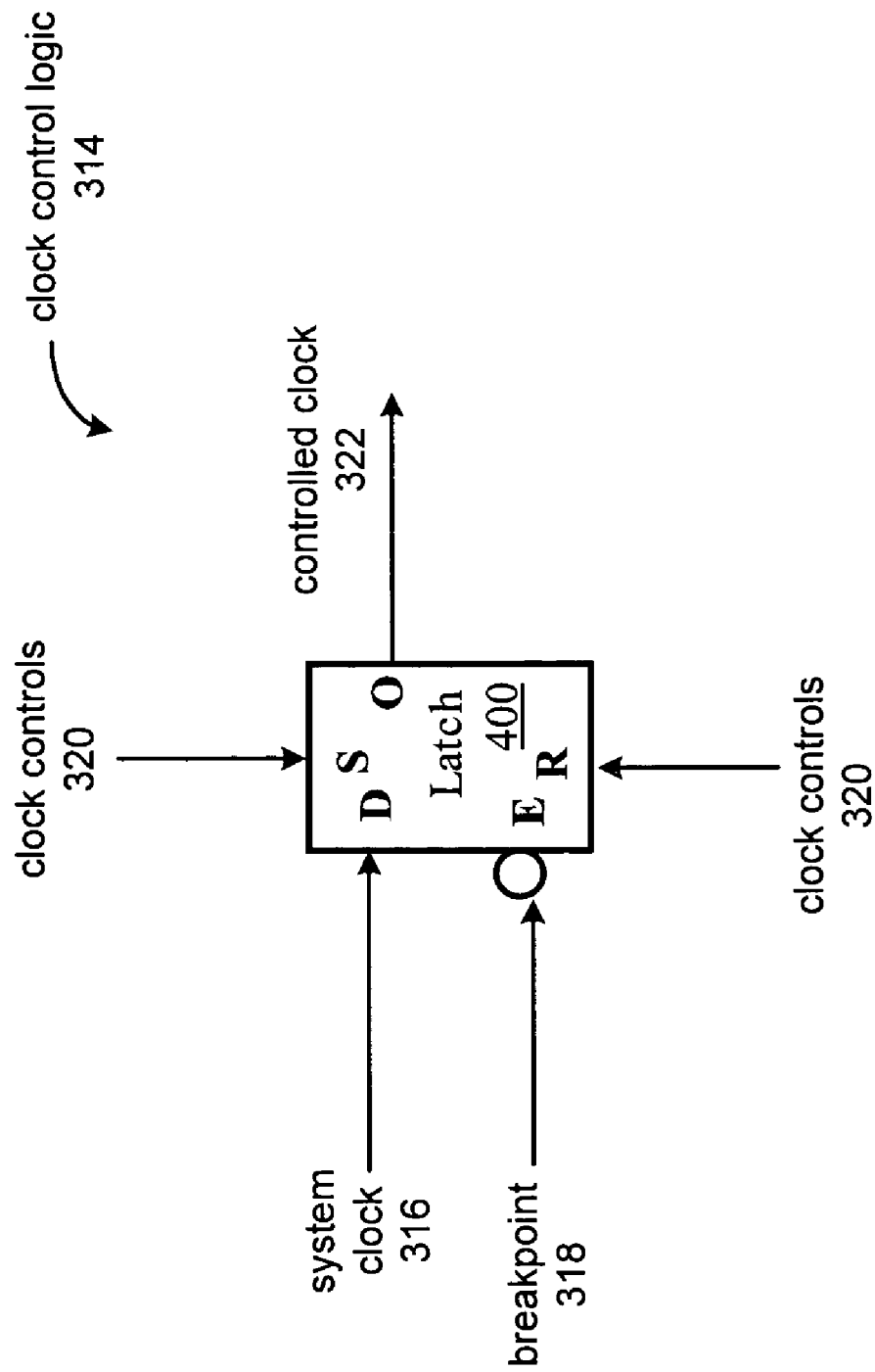
FIG. 4 illustrates an example of clock control logic according to an embodiment of the invention.

FIG. 4 illustrates an example of the clock control logic 314 according to an embodiment of the invention. During normal operation, the system clock 316 that clocks the circuit flows through the latch 400 and acts as the clock 322 to the replicated logic block 304. The breakpoint 318 switches the clock 322 to a latched version of the system clock 316, which can be controlled by clock control signals 320 in order to allow the clock 322 to be paused and single-stepped on a cycle by cycle basis.

Thus, embodiments of a method and apparatus for debug and test using replicated logic have been described. The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method comprising:
   compiling a representation of a circuit, the circuit including a replicated portion and delay logic to delay inputs into the replicated portion;
   selecting one or more triggering signals;
   setting one or more states for each selected triggering signal to setup a trigger condition;
   recording data that includes one or more states of one or more registers in the replicated portion of the circuit and a sequence of inputs that led to the trigger condition when the trigger condition occurs; and
   generating a test based on the recorded data, the test including the recorded states of the registers and the sequence of inputs that led to the trigger condition.

2. The method of claim 1, wherein the representation of the circuit is written in a hardware description language (HDL).

3. The method of claim 1, wherein generating a test based on the recorded data comprises converting the recorded data to a format compatible with a software simulator.

4. The method of claim 3, wherein converting the recorded data to a format compatible with a software simulator comprises converting the recorded data to a VHDL format to be compatible with a VHDL simulator.

5. The method of claim 3, wherein converting the recorded data to a format compatible with a software simulator comprises convening the recorded data to a Verilog format to be compatible with a Verilog simulator.

6. The method of claim 3, further comprising running the test on the software simulator when the circuit is modified.

7. The method of claim 1, wherein compiling the representation of the circuit comprises compiling the representation of the circuit to generate a register transfer level netlist.

8. The method of claim 7, further comprising mapping the register transfer level netlist to a selected technology architecture.

9. The method of claim 8, further comprising performing a place and route operation to implement the circuit in the selected technology architecture.

10. The method of claim 9, further comprising programming the register transfer level netlist into a programmable hardware device.

11. The method of claim 10, wherein the circuit further includes trigger logic and clock control logic coupled to the replicated portion of the circuit to enable execution of the replicated portion of the circuit to be paused when the trigger condition occurs.

12. The method of claim 11, further comprising running the circuit on the programmable hardware device and pausing the replicated portion of the circuit when the trigger condition occurs.

13. An article of manufacture comprising:
   a machine accessible medium storing executable program instructions that when executed by a machine causes the machine to perform operations including:
   compiling a representation of a circuit, the circuit including a replicated portion and delay logic to delay inputs into the replicated portion;
   selecting one or more triggering signals;
   setting one or more states for each selected triggering signal to setup a trigger condition;
   recording data that includes one or more states of one or more registers in the replicated portion of the circuit and a sequence of inputs that led to the trigger condition when the trigger condition occurs; and
   generating a test based on the recorded data, the test including the recorded states of the registers and the sequence of inputs that led to the trigger condition.

14. The article of manufacture of claim 13, wherein generating a test based on the recorded data comprises converting the recorded data to a format compatible with a software simulator.

15. The article of manufacture of claim 14, wherein the machine-accessible medium further includes content that causes the machine to perform operations comprising running the test on the software simulator when the circuit is modified.

16. The article of manufacture of claim 13, wherein compiling the representation of the circuit comprises compiling the representation of the circuit to generate a register transfer level netlist.

17. The article of manufacture of claim 16, wherein the machine-accessible medium further includes content that causes the machine to perform operations comprising mapping the register transfer level netlist to a selected technology architecture.

18. The article of manufacture of claim 17, wherein the machine-accessible medium further includes content that causes the machine to perform operations comprising performing a place and route operation to implement the circuit in the selected technology architecture.

19. The article of manufacture of claim 18, wherein the machine-accessible medium further includes content that causes the machine to perform operations comprising programming the register transfer level netlist into a programmable hardware device.

* * * * *